United States Patent [19]

Hoffmann et al.

[11] 4,242,600

[45] Dec. 30, 1980

[54] DIGITAL CCD ARRANGEMENT

[75] Inventors: Kurt Hoffmann, Taufkirchen; Manfred Mauthe, Munich, both of Fed. Rep. of Germany

[73] Assignee: Siemens Aktiengesellschaft, Berlin & Munich, Fed. Rep. of Germany

[21] Appl. No.: 897,939

[22] Filed: Apr. 19, 1978

[30] Foreign Application Priority Data

May 10, 1977 [DE] Fed. Rep. of Germany ....... 2721039

[51] Int. Cl.³ .................. G11C 19/28; H01L 29/78
[52] U.S. Cl. ................................ 307/221 D; 357/24
[58] Field of Search .................... 357/24; 307/221 D

[56] References Cited

U.S. PATENT DOCUMENTS

| 3,937,985 | 2/1976 | Cooper | 307/221 D |
| 3,986,059 | 10/1976 | Mohsen | 307/221 D |
| 4,048,519 | 9/1977 | Hoffman et al. | 307/221 D |
| 4,092,549 | 5/1978 | Prince | 307/221 D |
| 4,093,872 | 6/1978 | Hartman et al. | 307/221 D |

OTHER PUBLICATIONS

Kosonocky, "Charge-coupled devices-An Overview" Wescon Technical Papers, vol. 18 (9/74), No. 211, pp. 1-20.
Tompsett, "A Simple Charge Regenerator for use with Charge Transfer Devices . . ." IEEE J. Solid-State Circuits, vol. SC-7(6/72) pp. 237-242.
Varshney, "A Byte Organized NMOS/CCD Memory With Dynamic Refresh Logic" IEEE J. Solid-State Circuits, vol. SC-11(2/76) pp. 18-24.
Stinson, "Regenerative Photocell Using Charge-Coupled Device Structure" IBM Technical Disclosure Bulletin, vol. 16 (7/73) pp. 632-633.

*Primary Examiner*—Gene M. Munson
*Attorney, Agent, or Firm*—Hill, Van Santen, Steadman, Chiara & Simpson

[57] ABSTRACT

A digital CCD arrangement is provided in which an output signal is emitted which is regenerated with respect to its voltage range, and is substantially insensitive to adverse influences. In this arrangement, the last shift electrode preceding the output end zone is coupled with respect to potential to a circuit point of a transistor stage, which point in the event of a quantity of charge carriers representing logic level "1," the output end zone experiences a change in potential which corresponds to the change in potential beneath the other shift electrodes. Between the last preceding shift electrode and the output end zone, there is arranged a further electrode which is insulated from the semiconductor layer and is connected to a second reference potential which corresponds to an intermediate value which is swept over by the potential across the circuit point.

6 Claims, 5 Drawing Figures

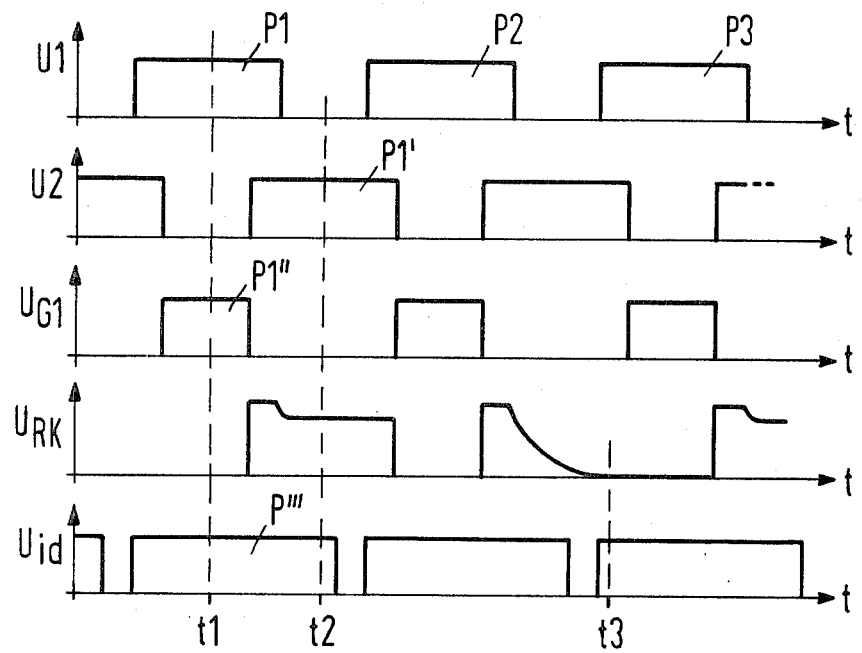
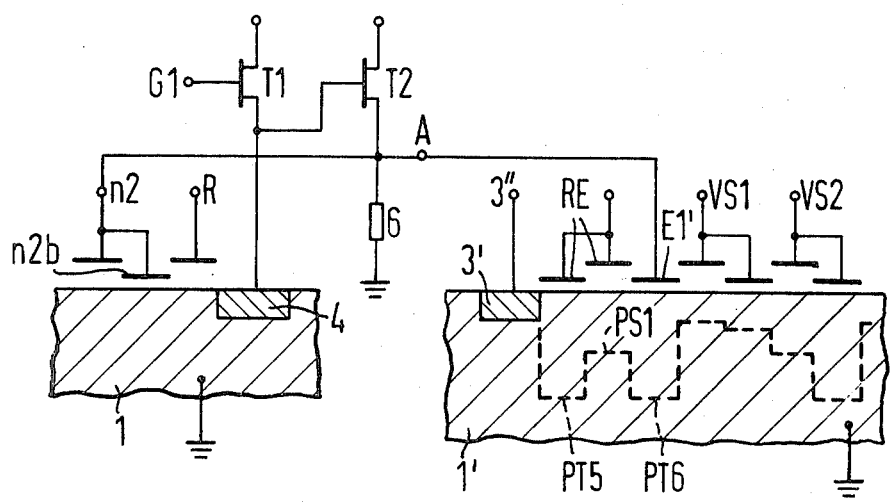

DIGITAL CCD ARRANGEMENT

BACKGROUND OF THE INVENTION

This invention relates to a digital CCD (charge coupled device) arrangement of the type which includes a semiconductor layer of the first conductivity type, a row of shift electrodes arranged in insulated fashion above said semiconductor layer, which electrodes are fed with pulse train voltages displaced in phase relative to one another. The arrangement further includes an output end zone of a conductivity type opposite to that of said semiconductor layer, which is connected on the one hand to a switch which intermittently supplies a first reference potential and, on the other hand, to the input of a transistor stage.

Arrangements of this kind are described in the publication by Kosonocky "Charge-Coupled Device—An Overview" in the Wescon Technical Papers, Vol. 18, September 1974, No. 2/1, pages 1 to 20, wherein the consecutive logic states of a digital input signal are consecutively evaluated in that the one logic state (e.g., "1") leads to an accumulation of charge carriers in a potential well beneath the first shift electrode, whereas the other logic state, e.g., "0", does not. Since, between the individual evaluation processes, the previously formed charge carriers are shifted by a predetermined number of electrode intervals, the digital input signal is converted into a sequence of charge carrier parcels and displaced in this form in the semiconductor layer along the row of electrodes in the direction towards the output-end zone of opposite conductivity type in stepped fashion. The output-end field effect transistor stage which is illustrated in FIG. 10(b) of this publication and which initially emits a first logic signal level of a digital output signal, is caused to emit a second logic signal level when the individual charge carrier parcels penetrate into the output end zone so that a digital output signal is formed which corresponds to the input signal and normally is inverted. Due to the so-called dark current which arises from thermally generated charge carriers, however, in addition undesired charge carriers are accumulated beneath the electrodes and adulterate the described process. A further fault influence consists in that not all the charge carriers are transported from one shift electrode to the next. Due to these adverse influences, the voltage range of the output signal can be reduced to such an extent that in many cases it is no longer adequate to ensure fault-free signal transmission.

So-called regenerator circuits are now employed, the function of which is to re-establish the full voltage range between the logic signal states of the output signal.

In the integrated MOS circuit technique, for the purpose of regeneration, for example, in addition to a first CCD arrangement, on the same substrate there is provided a similar, second arrangement which is operated with the same pulse train voltages (see IEEE Journal of Solid-State Circuits, Vol. SC-7, 1972, pages 237–242, in particular FIG. 3), wherein, in the semiconductor layer of the first arrangement beneath one of the shift electrodes there is provided an oppositely doped semiconductor zone which is connected to a shift electrode of the second arrangement which serves as input electrode for that part of this arrangement which lies at its output end. The charge carriers of the first arrangement which represent the binary input signal then control the potential of the shift electrode which is employed as input electrode, the signal analysis taking place at the output of the second arrangement. However, fault-free signal transmission is conditional upon the shift electrode which serves as input electrode being provided with a sufficient potential difference during the sampling of the charges which have been shifted in the first arrangement.

The IEEE Journal of Solid-State Circuits, Vol. SC-11, 1976, No. 1, pages 18–24, in particular FIG. 8, relates to a CCD arrangement of the type described above, having a regenerating logic in MOS technology which contains a flip-flop. This flip-flop is fed on the one hand with the potential of the output-end zone of opposite conductivity and on the other hand with a reference voltage which is formed in a further CCD arrangement comprising a following comparator circuit, in that said reference voltage lies between the potentials of the output-end zone during the evaluation of the logic states "0" and "1". Then, in dependence upon the overshooting or undershooting of a reference voltage by the potential of the output-end zone, a digital signal exhibiting a satisfactory voltage range is emitted from the outputs of the flip-flop. The circuitry outlay required for this purpose is considerable however. In this known arrangement, the output-end zone of opposite conductivity is additionally preceded by an electrode which is insulated from the semiconductor layer and which is connected to a predetermined, further reference potential which serves as potential barrier.

SUMMARY OF THE INVENTION

It is an object of the present invention to provide a digital CCD arrangement of the type referred to above, in which an output signal is emitted which is regenerated in respect of its voltage range, and is substantially insensitive to its aforesaid influences.

The present invention includes a CCD arrangement of the above general type in which the last shift electrode preceding the output end zone is coupled with respect to potential to a circuit point of a transistor stage, which point, in the event of a quantity of charge carriers representing logic level "1" in the output end zone experiences a change in potential which corresponds to the change in potential beneath the other shift electrodes, and that between the last preceding shift electrode and the output-end zone, there is arranged a further electrode which is insulated from the semiconductor layer and is onnected to a second reference potential which corresponds to an intermediate value which is swept over by the potential across the circuit point.

The advantage which can be achieved by the invention consists in particular in that a low cost output stage can be used to maintain an extremely low bit error rate of the digital output signal relative to the input signal while the output signal simultaneously possesses an optimum voltage range. The reference voltage provided to erect a potential barrier preceding the output-end zone in no way reduces the aforesaid voltage range.

BRIEF DESCRIPTION OF THE DRAWINGS

In the following, the invention will be explained in detail making reference to the drawings, in which:

FIG. 4 shows voltage-time diagrams relating to FIG. 1; and

FIG. 5 shows the combination of the examplary embodiment illustrated in FIG. 1 with a further CCD arrangement.

DESCRIPTION OF THE PREFERRED EMBODIMENTS

Figure 1:
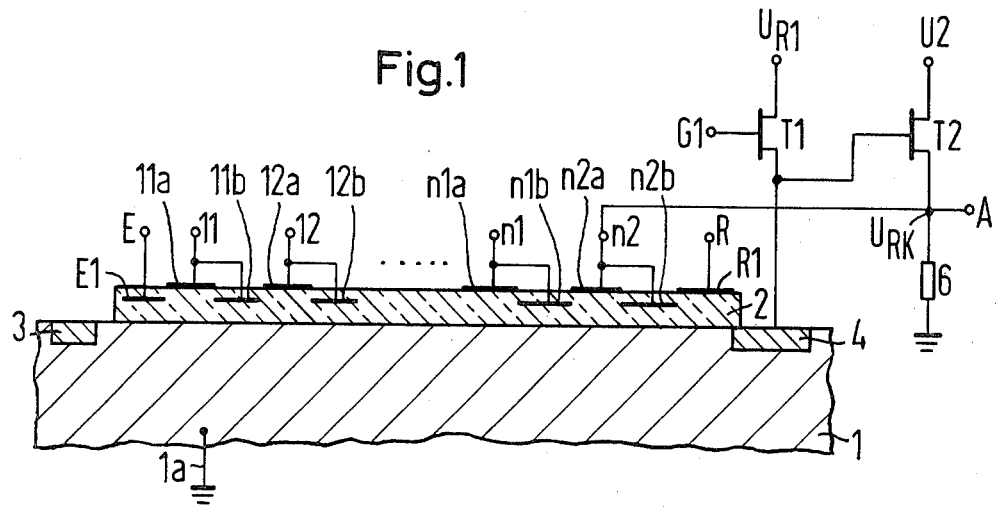
FIG. 1 illustrates a preferred exemplary embodiment of the invention.

FIG. 1 schematically illustrates a two-phase CCD arrangement. This consists of a p-doped silicon substrate 1, the surface of which is coated with an electrically insulating layer 2, electrodes E1, 11b, 12b ... n1b and n2b are arranged in such a manner that they lie in a lower plane closer to the surface of the substrate 1, whereas further electrodes 11a, 12a ... n1a, n2a and R1 lie in a higher plane more distant from the substrate surface. This is indicated in FIG. 1 in that the last mentioned electrodes contact the surface of the layer 2. It is also possible to provide further insulating layers which cover these electrodes, but which have not been illustrated for reasons of clarity. The electrode combination 11a, 11b is fed via a common terminal 11 with a pulse train voltage U1, the time diagram of which is illustrated in FIG. 4. The following electrode combination 12a, 12b receives a pulse train voltage U2 (FIG. 4) via a common terminal 12. The right-hand adjoining electrode combinations which have not been illustrated in detail are then connected in turn to U1, U2, U1, etc. Of the electrode combinations n1a, n1b and n2a, n2b located at the end of the row of electrodes, the first is connected via the common terminal n1 to U1, and the last is connected via the common terminal n1 to U1, and the last is connected via the terminal n2 not to U2, as would have been expected in accordance with the alternating assignment, but to a voltage $U_{RK}$ likewise shown in FIG. 4.

The aforementioned electrode combinations are also referred to as shift electrodes. The electrode E1 which in the following is referred to as input electrode leads to the circuit input terminal E. The electrode R1 possesses a terminal R. 3 designates an n+—doped zone which serves as source zone for the CCD arrangement, whereas 4 designates an output-end, likewise n+—doped zone. The output-end zone 4 is connected via a line 5 to the source terminal of a field effect switching transistor T1, the drain terminal of which is connected to a first reference voltage $U_{R1}$. The gate terminal of T1 is designated G1. The source terminal of T1 is connected to the gate of a field effect transistor stage T2, the source terminal of T2 being connected via an impedance 6 to ground potential, while its drain terminal is connected to the pulse train voltage U2. The connection point between the source terminal of T2 and the impedance 6 simultaneously represents the circuit output A from which the output signal is tapped. A is connected to the common terminal n2 of the last shift electrode which precedes the output-end zone 4.

Figure 2:
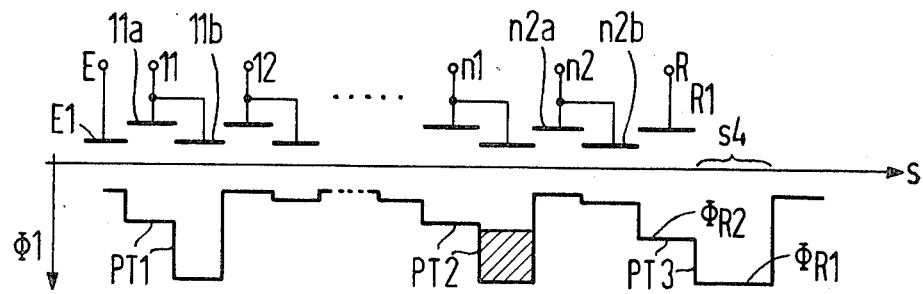
FIG. 2 shows a potential curve relating to FIG. 1.

As seen in FIG. 4, under the influence of the pulse train voltage U1, on the occurrence of one of the positive voltage pulses P1, P2, P3, etc., thus, for example, at the time t1, on the surface of the substrate 1 beneath the shift electrodes there is produced a potential curve $\phi1$ in accordance with FIG. 2. In this illustration, $\phi1$ is plotted over the axis s which extends in the longitudinal direction of the substrate 1 beneath the row of electrodes. So-called potential wells PT1, PT2, etc., are formed beneath the shift electrodes which are connected to P1. If minority charge carriers are injected out of the zone 3 into the substrate 1 and a digital input signal with a high signal level is simultaneously present at the circuit input E, that part of the potential well TP1 located beneath the electrode 11b is practically filled with charge carriers of this type. Following the occurrence of the next positive pulse P1' of U2, thus, for example, at the time t2, there is a shifting of the potential wells PT1, etc., and thus of the charge carriers which have accumulated in the latter in each case into the region of the adjacent shift electrode in the direction s; a potential curve $\phi2$ in accordance with FIG. 3 now occurs on the surface of the substrate 1.

The potential well PT3 in FIG. 2 is formed in that a positive voltage pulse P1'' of a voltage $U_{G1}$ supplied to G1 switches the transistor T1 conductive so that the zone 4 is connected to a reference voltage $U_{R1}$ for the duration of P1'' and thus is reset to a first reference potential $\phi_{R1}$. In FIG. 2, the width of the zone 4 is referenced s4. The terminal R is constantly connected to a second reference voltage which produces a second reference potential $\phi_{R2}$ beneath R1. Following the rear flank of each pulse P1'', the zone 4 is disconnected from $U_{R1}$ so that it assumes the so-called floating state. For such time as the zone 4 is impressed with the potential $\phi_{R1}$ or this potential does not fundamentally change in the floating state, T2 is conductive and during the occurrence of one of the pulses P1' of U2 a voltage $U_{RK}$ corresponding approximately to U2 drops across the impedance 6 and across the circuit point A relative to ground. There now arrives the voltage conditions indicated at the time t2 in FIG. 4, and the potential curve $\phi2$ shown in a solid line in the right-hand part of FIG. 3, since the voltage $U_{RK}$ also forms the potential well PT4 via n2.

Figure 3:
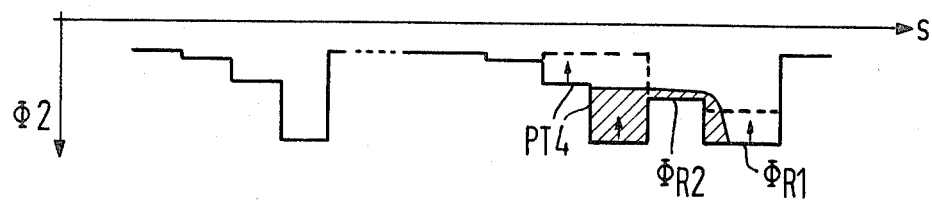
FIG. 3 shows the change in a potential curve relating to FIG. 1 during the read-out of an information unit.

If, however, a charge carrier parcel has been shifted into the potential well PT4, which is illustrated in FIG. 3 by a shaded area, and there is a continued gradual disintegration of PT3 in the region s4 across the constant potential threshold $\phi_{R2}$, $\phi_{R1}$ changes in FIG. 3 in accordance with the arrow. The transistor T2 which consequently becomes increasingly conductive results in a drop in $U_{RK}$ across the circuit point A which leads to a potential change beneath the electrode combination n2a, n2b in the direction of the arrows entered in FIG. 3. The end potentials reached beneath s4 and n2a, n2b are shown in broken lines in FIG. 3, and are characterized by the time t3 in FIG. 4. If sampling is carried out of the voltage at the output A following the times t2 and t3, and before the next pulse P1'', without the above described feedback process $U_{RK}$ exhibits a high voltage level which corresponds to a low logic signal level transmitted in the substrate 1 and to a logic "0", whereas in the event of a feedback process there occurs a low voltage level of $U_{RK}$ which corresponds to a high logic signal level transmitted in 1 and to a logic "1".

The second reference potential $\phi_{R2}$ corresponds to an intermediate value of the potential changes occurring across A and beneath n2a, n2b. Here the value of $\phi_{R2}$ is selected to be such that the potential threshold beneath R1 can be exceeded only by those charge carrier parcels which characterize a logic "1". Simulated "1" signals which are formed, for example, by the dark current influence during the shift in 1, do not fill the potential well beneath n2a, n2b to the level of the potential threshold, do not produce any potential shifts in the region of s4, and consequently also not beneath n2a and n2b. Therefore, faults influences of this type are not taken into account and cannot reduce the voltage range at the output A.

The conductivity conditions of the substrate 1 and of the layers 3 and 4 which have been described in association with FIG. 1 can also be interchanged. Furthermore, CCD arrangements of any design, including those which are pulsed differently, can be constructed in accordance with the invention.

In any case, however, the last shift electrode arranged in front of the oppositely doped output zone is released of the pulse train voltage which it is normally assigned, and is fed with a voltage which is obtained via a circuit point of the output-end transistor circuit and which, when a charge carrier parcel is shifted into the output-end zone of opposite conductivity, experiences a change in amplitude which corresponds to the potential changes occurring under the influence of the pulse train voltages beneath the shift electrodes.

In FIG. 5, a CCD arrangement corresponding to FIG. 1 and provided with like references is connected via its circuit output A to a second CCD arrangement which is of similar construction and whose p-doped substrate is referenced 1'. An n+—doped zone 3' serves as charge carrier injector. An input electrode E1' is connected to A. A combination of reference electrodes RE arranged between 3' and E1', serves to form a potential well PT4 and a potential threshold PS1. During the individual, positive voltage pulses P''' of a voltage $U_{id}$ connected to a terminal 3'', charge carriers injected into the substrate 1' pass into the potential well PT6 on the occurrence of a high signal level of $U_{RK}$, whereas they do not meet with such a potential well on the occurrence of a low signal level of $U_{RK}$ and during the following pulse P''' flow back into the layer 3' and into PT5. In this way, beneath E1' there is formed a sequence of charge carrier parcels which occur whenever the absence of a charge carrier parcel beneath n2b is established via the zone 4. The charge carrier parcels formed in PT6 are transported from the latter in the substrate 1' in the direction towards the right-hand output of the overall arrangement in FIG. 5, by means of shift electrodes pulsed in conventional manner via the terminals VS1, VS2, etc.

It will be apparent to those skilled in the art that many modifications and variations may be effected without departing from the spirit and scope of the novel concepts of the present invention.

We claim as our invention:

1. A digital charged coupled device (CCD) circuit arrangement comprising a semiconductor substrate of one conductivity type, a layer of insulating material on one surface of said substrate, a plurality of shift electrodes separated from said substrate by said insulating layer; one group of said electrodes lying in one plane and separated from said substrate by a relatively thick portion of said layer of insulating material, a second group of said electrodes lying in a lower plane and separated from said substrate by a relatively thin portion of said layer of insulating material, one electrode on said one plane and, an adjacent one electrode on said lower plane being electrically connected to form a pair, the remaining shift electrodes being similarly paired, a first pulse train voltage source connected seriatim to every other one of said pairs, a second pulse train voltage source displaced in phase relative to said first pulse train voltage source and connected seriatim to the remaining pairs of said shift electrodes, said substrate having an input end diffused zone of the opposite conductivity type to said substrate, an input electrode in said insulating layer in said lower plane ahead of the first of said shift electrode pairs, said substrate having a ground terminal, an output end diffusion zone of said opposite conductivity type on said substrate, an output end electrode lying in said one plane and constantly connected to a first reference voltage source, a field effect transistor having its drain connected to said first reference voltage source and its source connected to said output end diffused zone and its gate connected to a pulse train voltage source which is in phase with but having less pulse width than said first pulse train voltage source, a second field effect transistor having its drain connected to said second pulse train voltage source and its gate connected to said source of said first transistor, an output terminal, an impedance element connected through a circuit node between the source of said second field effect transistor and ground, said circuit node being connected to the last of said electrode pairs and to said output terminal.

2. A digital charge coupled device (CCD) circuit arrangement as claimed in claim 1, in which said circuit node is the connection point of the source-drain path of said second field effect transistor and a load element which is connected in series with one another and connected to a supply voltage.

3. A digital charge coupled device (CCD) circuit arrangement as claimed in claim 1, in which said circuit node consists of the source terminal of said second field effect transistor connected as a source follower.

4. A digital charge coupled device (CCD) circuit arrangement as claimed in claim 2, in which said circuit node simultaneously forms the digital circuit output.

5. A digital charge coupled device (CCD) circuit arrangement as claimed in claim 4, in which said drain terminal of said second field effect transistor is connected to one of the pulse train voltages.

6. A digital charge coupled device (CCD) circuit arrangement as claimed in claim 5, in which said circuit node is connected to the input electrode of a following further CCD circuit arrangement.

* * * * *